(12) United States Patent
Cho et al.

(10) Patent No.: US 8,809,997 B2
(45) Date of Patent: Aug. 19, 2014

(54) E-FUSE STRUCTURES AND METHODS OF OPERATING AND MANUFACTURING THE SAME

(75) Inventors: Yongsang Cho, Hwaseong-si (KR); Intaek Ku, Suwon-si (KR); Donghoon Kim, Bucheon-si (KR); Ikhwan Kim, Hwaseong-si (KR); Choulhwan Oh, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 117 days.

(21) Appl. No.: 13/517,788

(22) Filed: Jun. 14, 2012

(65) Prior Publication Data

US 2012/0319234 A1   Dec. 20, 2012

(30) Foreign Application Priority Data

Jun. 17, 2011 (KR) ........................ 10-2011-0059134

(51) Int. Cl.
*H01L 23/525* (2006.01)
(52) U.S. Cl.
CPC ................................. *H01L 23/5256* (2013.01)
USPC ................... 257/529; 257/209; 257/E21.592; 257/E23.149; 438/132
(58) Field of Classification Search
CPC .......................... H01L 23/525; H01L 23/5256
USPC ................. 257/209, 529, E21.592, E23.149; 438/132, 215, 467
See application file for complete search history.

(56) References Cited

U.S. PATENT DOCUMENTS

| 4,494,135 | A  | * | 1/1985  | Moussie ........................ 257/50 |
|-----------|----|---|---------|---------------------------------------|
| 6,323,535 | B1 |   | 11/2001 | Iyer et al.                            |
| 6,580,156 | B1 |   | 6/2003  | Ito et al.                             |
| 6,650,143 | B1 |   | 11/2003 | Peng                                   |
| 6,667,902 | B2 |   | 12/2003 | Peng                                   |
| 6,933,591 | B1 | * | 8/2005  | Sidhu et al. ................... 257/665 |
| 7,153,712 | B1 | * | 12/2006 | Sidhu et al. ..................... 438/17 |
| 7,659,168 | B2 |   | 2/2010  | Hsu et al.                             |
| 7,820,492 | B2 |   | 10/2010 | Miyashita et al.                       |
| 8,102,019 | B1 | * | 1/2012  | Tumakha et al. ............. 257/529   |
| 8,399,959 | B2 | * | 3/2013  | Vasiliu .......................... 257/530 |
| 2004/0041168 | A1 | * | 3/2004 | Hembree et al. ............. 257/173   |
| 2007/0026579 | A1 |   | 2/2007 | Nowak et al.                           |
| 2008/0067600 | A1 | * | 3/2008 | Hsu et al. ....................... 257/360 |
| 2008/0153278 | A1 |   | 6/2008 | Nowak et al.                           |
| 2008/0169529 | A1 |   | 7/2008 | Kim et al.                             |
| 2009/0302417 | A1 |   | 12/2009 | Kim et al.                            |

FOREIGN PATENT DOCUMENTS

| EP | 1351254 A2   | 10/2003 |
|----|--------------|---------|
| JP | 2008-294448  | 4/2008  |
| KR | 1020080064149 | 7/2008 |

* cited by examiner

*Primary Examiner* — Allan R Wilson
(74) *Attorney, Agent, or Firm* — F. Chau & Associates, LLC

(57) ABSTRACT

An e-fuse structure includes a first doped region and a second doped region formed in a substrate. The first doped region has a first conductivity type and the second doped region has a second conductivity type different from the first conductivity type. The first and second doped regions contact each other. A conductive pattern is disposed on the first and second doped regions and contacts the first and second doped regions. A first contact plug is disposed on the conductive pattern in an area corresponding to the first doped region, and a second contact plug is disposed on the conductive pattern in an area corresponding to the second doped region.

11 Claims, 11 Drawing Sheets

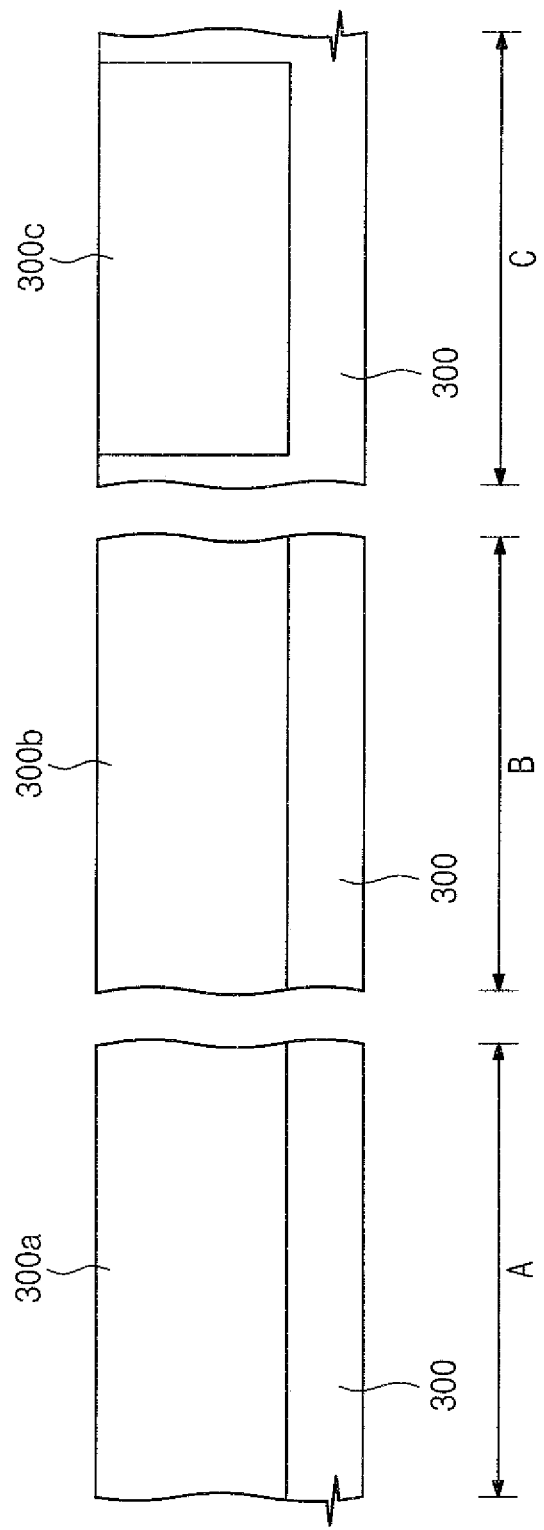

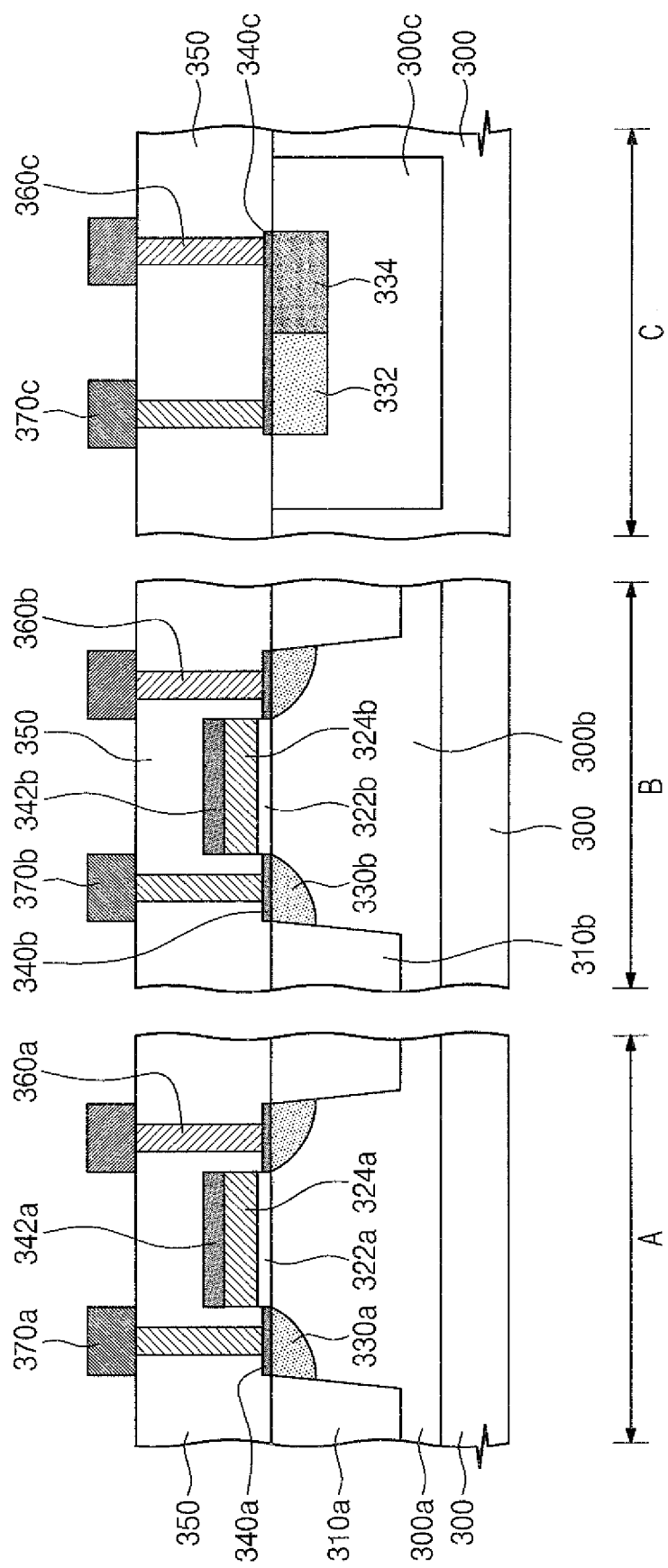

E-FUSE STRUCTURES AND METHODS OF OPERATING AND MANUFACTURING THE SAME

CROSS-REFERENCE TO RELATED APPLICATIONS

This application claims priority under 35 U.S.C. §119 to Korean Patent Application No. 10-2011-0059134, filed on Jun. 17, 2011, the disclosure of which is incorporated by reference herein in its entirety.

TECHNICAL FIELD

The present inventive concept relates to e-fuse structures, and methods of operating and manufacturing the same.

DISCUSSION OF THE RELATED ART

Semiconductor devices are frequently used in the electronic industry due to their small size, versatility, and low fabrication cost. Semiconductor devices may be categorized as memory devices that store logic data, and logic devices that perform logic operations. Semiconductor devices may include fuse structures that perform various functions. However, fabricating and programming fuse structures in semiconductor devices may be time-consuming and/or costly due to various technical limitations. Additionally, as advances are made in the electronic industry, the demand for semiconductor devices that are highly integrated and also include fuse structures, as well as the demand for fuse structures having various characteristics, has been increasing.

SUMMARY

Exemplary embodiments of the inventive concept may provide e-fuse structures having high reliability, and methods of operating and manufacturing the same.

Exemplary embodiments of the inventive concept may provide e-fuse structures designed for higher integration, and methods of operating and manufacturing the same.

According to an exemplary embodiment of the inventive concept, an e-fuse structure includes a first doped region of a first conductivity type, which is formed in a substrate, a second doped region of a second conductivity type, which is formed in the substrate and in contact with the first doped region, a conductive pattern covering the first and second doped regions and being in contact with the first and second doped regions, a first contact plug disposed on the conductive pattern covering the first doped region, and a second contact plug disposed on the conductive pattern covering the second doped region.

In an exemplary embodiment, the e-fuse structure may further include a well region formed in the substrate. The first and second doped regions may be formed in the well region.

In an exemplary embodiment, the well region may include a first part of the first conductivity type and a second part of the second conductivity type. The first part may surround the first doped region and the second part may surround the second doped region.

In an exemplary embodiment, a concentration of dopants of the first conductivity type of the first doped region may be substantially higher than a concentration of dopants of the first conductivity type of the first part, and a concentration of dopants of the second conductivity type of the second doped region may be substantially higher than a concentration of dopants of the second conductivity type of the second part.

In an exemplary embodiment, the first and second doped regions may be arranged in a first direction. The first doped region may include a first portion having a first width in a second direction perpendicular to the first direction, and a second portion having a second width substantially less than the first width in the second direction. The second doped region may include a third portion having a third width in the second direction, and a fourth portion having a fourth width substantially less than the third width in the second direction. The second portion may be in contact with the fourth portion.

In an exemplary embodiment, the second width of the second portion may become progressively less from the first portion toward the fourth portion.

In an exemplary embodiment, the first and second doped regions may be arranged in a first direction. The first doped region may include a first portion having a first width and a second portion having a second width in a second direction perpendicular to the first direction, and the second width of the second portion becomes progressively less toward the second doped region. The second doped region may include a third portion having a third width and a fourth portion having a fourth width in the second direction. The fourth width of the fourth portion becomes progressively less toward the first doped region. The second portion may be in contact with the fourth portion.

In an exemplary embodiment, the conductive pattern may include first and second segments which are disconnected from each other and are in contact with the first and second contact plugs, respectively.

In an exemplary embodiment, the first and second contact plugs may be electrically connected to each other through the conductive pattern.

In an exemplary embodiment, the substrate may include a base substrate, a buried insulating layer on the base substrate, and a semiconductor material layer on the buried insulating layer, and the well region may be formed in the semiconductor material layer.

In an exemplary embodiment, the e-fuse structure may further include a device isolation pattern surrounding the well region and the semiconductor material layer.

In an exemplary embodiment, the conductive pattern may include a metal-semiconductor compound.

According to an exemplary embodiment of the inventive concept, a method of operating an e-fuse structure may include preparing an e-fuse structure including a first doped region of a first conductivity type disposed in a substrate, a second doped region of a second conductivity type disposed in the substrate to be in contact with the first doped region, a conductive pattern covering the first and second doped regions, and first and second contact plugs respectively disposed on portions of the conductive pattern on the first and second doped regions, and separating the conductive pattern into first and second segments which are disconnected from each other by applying voltages of levels different from each other to the first and second contact plugs.

In an exemplary embodiment, the first and second segments may be in contact with the first and second contact plugs, respectively. In this case, the method may further include measuring a current value or a resistance value between the first and second contact plugs.

In an exemplary embodiment, the first doped region and the second doped region may be doped with P-type dopants and N-type dopants, respectively. In this case, applying the voltages of levels different from each other to the first and second contact plugs may include applying a first voltage of a first level to the first contact plug; and applying a second voltage of a second level substantially higher than the first level to the second contact plug.

According to an exemplary embodiment of the inventive concept, an e-fuse structure includes a first doped region having a first conductivity type, a second doped region having a second conductive type different from the first conductivity type, a conductive pattern, and first and second contact plugs. The first and second doped regions are formed in a substrate and contact each other. The conductive pattern is disposed on the first and second doped regions and contacts the first and second doped regions. The first contact plug is disposed on the conductive pattern in an area corresponding to the first doped region, and the second contact plug is disposed on the conductive pattern in an area corresponding to the second doped region.

According to an exemplary embodiment of the inventive concept, a method of operating an e-fuse structure includes applying a first voltage to a first contact plug, and applying a second voltage to a second contact plug. The first contact plug is disposed on a first segment of a conductive pattern, the first segment contacts a first doped region having a first conductivity type, and the first doped region is disposed in a substrate. The second contact plug is disposed on a second segment of the conductive pattern, the second segment contacts a second doped region having a second conductivity type different from the first conductivity type, the second doped region is disposed in the substrate and contacts the first doped region, and the second voltage is different from the first voltage. The first and second segments are disconnected from each other upon applying the first and second voltages.

According to an exemplary embodiment of the inventive concept, a method of manufacturing an e-fuse structure includes forming a well region in a substrate, forming a first doped region and a second doped region in the well region, forming a conductive pattern on the first and second doped regions, and forming a first contact plug and a second contact plug on the conductive pattern. The first doped region is doped with dopants having a first conductivity type, and the second doped region is doped with dopants having a second conductivity type different from the first conductivity type. The first contact plug contacts a portion of the conductive pattern corresponding to the first doped region, and the second contact plug contacts a portion of the conductive pattern corresponding to the second doped region.

BRIEF DESCRIPTION OF THE DRAWINGS

The above and other features of the inventive concept will become more apparent by describing in detail exemplary embodiments thereof with reference to the accompanying drawings, in which:

FIGS. 6A to 6C are cross-sectional views illustrating a method of manufacturing an e-fuse structure, according to exemplary embodiments of the inventive concept;

DETAILED DESCRIPTION OF THE EXEMPLARY EMBODIMENTS

Figure 1A:
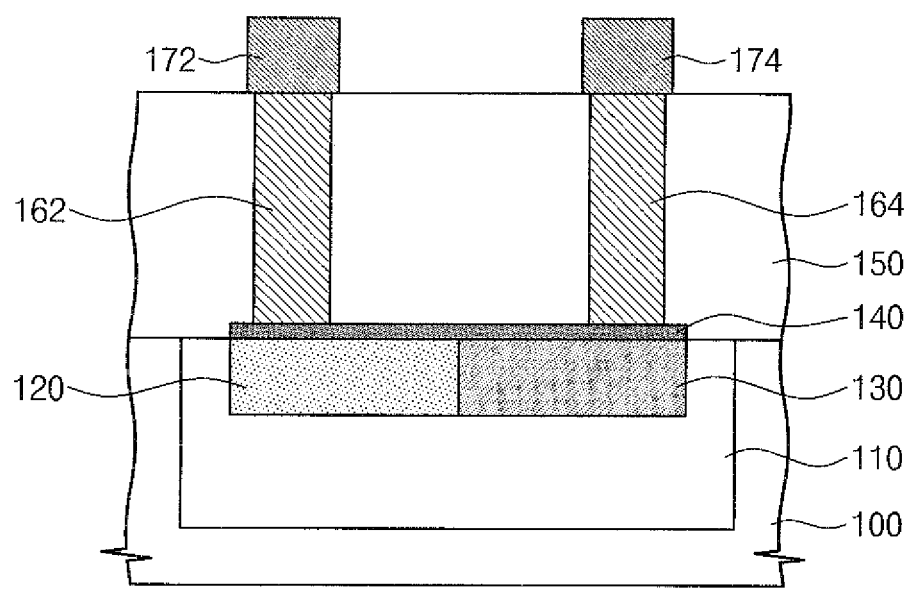
FIG. 1A is a-cross sectional view illustrating an e-fuse structure, according to an exemplary embodiment of the inventive concept.

Exemplary embodiments of the inventive concept will be described more fully hereinafter with reference to the accompanying drawings. Like reference numerals may refer to like elements throughout the accompanying drawings.

The terminology used herein is for the purpose of describing particular exemplary embodiments only and is not intended to limit the inventive concept. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on," "over," "covering" or "bordering" another element, it can be directly on, over, covering or bordering the other element or intervening elements may be present. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Exemplary embodiments in the detailed description will be described with sectional views. Shapes of the elements in the views may be modified according to manufacturing techniques and/or allowable errors. Therefore, the exemplary embodiments of the inventive concept are not limited to the specific shapes illustrated in the exemplary views, but may include other shapes that may be created according to manufacturing processes.

It will be also understood that although the terms first, second, third, etc. may be used herein to describe various elements, these elements should not be limited by these terms. These terms are only used to distinguish one element from another element. Thus, a first element in some exemplary embodiments could be termed a second element in other exemplary embodiments without departing from the teachings of the present inventive concept.

Exemplary embodiments are described herein with reference to cross-sectional illustrations and/or plane illustrations. Variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing.

FIG. 1A is a cross-sectional view illustrating an e-fuse structure, according to an exemplary embodiment of the inventive concept.

Referring to FIG. 1A, a substrate 100 is provided. The substrate 100 may be formed of a semiconductor material. For example, the substrate 100 may be a silicon substrate, a germanium substrate, or a silicon-germanium substrate, however the substrate 100 is not limited thereto.

In an exemplary embodiment, a well region 110 is disposed in the substrate 100. The well region 110 may be a portion of the substrate 100 that is doped with dopants of a first conductivity type.

In an exemplary embodiment, a first doped region 120 and a second doped region 130 are disposed in the well region 110 of the substrate 100. The first doped region 120 may be doped with dopants of the first conductivity type, and the second doped region 130 may be doped with dopants of a second conductivity type different from the first conductivity type. The first and second doped regions 120 and 130 may be in contact with each other in the well region 110, and may be included in a PN diode. A concentration of the dopants of the first conductivity type in the first doped region 120 may be substantially greater than a concentration of the dopants of the first conductivity type in the well region 110.

The first and second doped regions 120 and 130 may be bordered by the well region 110. Thus, the first and second doped regions 120 and 130 may be separated from the substrate 100 by the well region 110.

In an exemplary embodiment, a conductive pattern 140 is disposed on the substrate 100 including the well region 110, and covers the first and second doped regions 120 and 130. A single conductive pattern 140 may be in contact with both the first and second doped regions 120 and 130. The conductive pattern 140 may not cover an area of the well region 110 disposed adjacent to the first and second doped regions 120 and 130, as shown in FIG. 1A. The conductive pattern 140 may include a conductive material having a resistivity substantially less than a resistivity of the first and second doped regions 120 and 130. In an exemplary embodiment, the conductive pattern 140 may include a semiconductor-metal compound. For example, the conductive pattern 140 may include at least one of cobalt silicide, nickel silicide, titanium silicide, or tantalum silicide, however the conductive pattern 140 is not limited thereto.

In an exemplary embodiment, an interlayer dielectric layer 150 is disposed on the substrate 100 and covers the conductive pattern 140 and the first and second doped regions 120 and 130. The interlayer dielectric layer 150 may include oxide and/or nitride.

In an exemplary embodiment, first and second contact plugs 162 and 164 penetrate the interlayer dielectric layer 150 and make contact with the conductive pattern 140. The first and second contact plugs 162 and 164 may be electrically connected to each other through the conductive pattern 140.

In an exemplary embodiment, the first contact plug 162 is in contact with a portion of the conductive pattern 140 that covers the first doped region 120. The second contact plug 164 is in contact with another portion of the conductive pattern 140 that covers the second doped region 130. The first contact plug 162 may overlap with the first doped region 120 and may not overlap with the second doped region 130 when viewed from a plan view. The second contact plug 164 may overlap with the second doped region 130 and may not overlap with the first doped region 120 when viewed from a plan view.

In an exemplary embodiment, first and second interconnections 172 and 174 are disposed on the interlayer dielectric layer 150 and are connected to the first and second contact plugs 162 and 164, respectively.

An e-fuse structure according to an exemplary embodiment of the inventive concept includes the first and second doped regions 120 and 130 formed directly in the substrate 100 and contacting each other, and the conductive pattern 140 covering the first and second doped regions 120 and 130. Thus, an improved e-fuse structure allowing for higher integration may be provided.

Figure 1B:
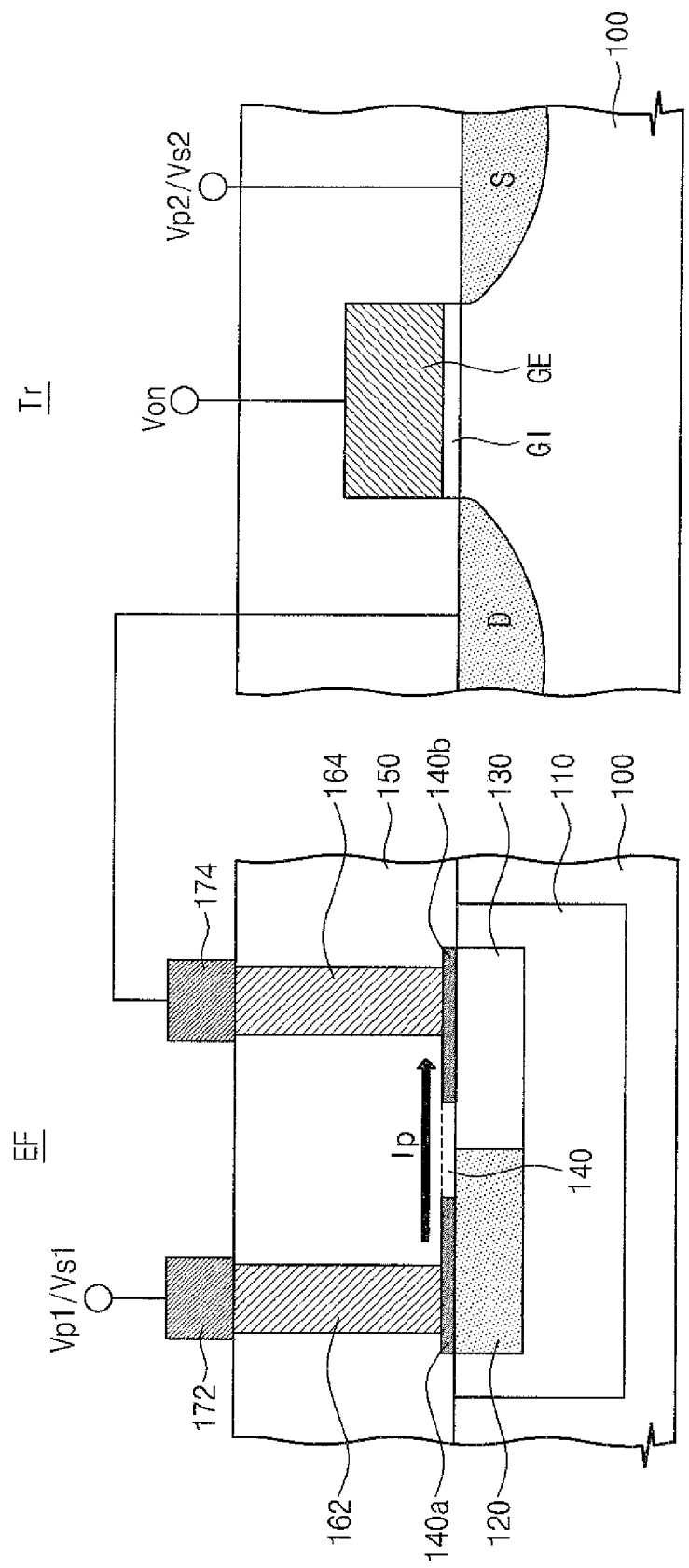
FIG. 1B is a cross-sectional view illustrating a method of programming and sensing an e-fuse structure, according to an exemplary embodiment of the inventive concept.
Figure 1C:
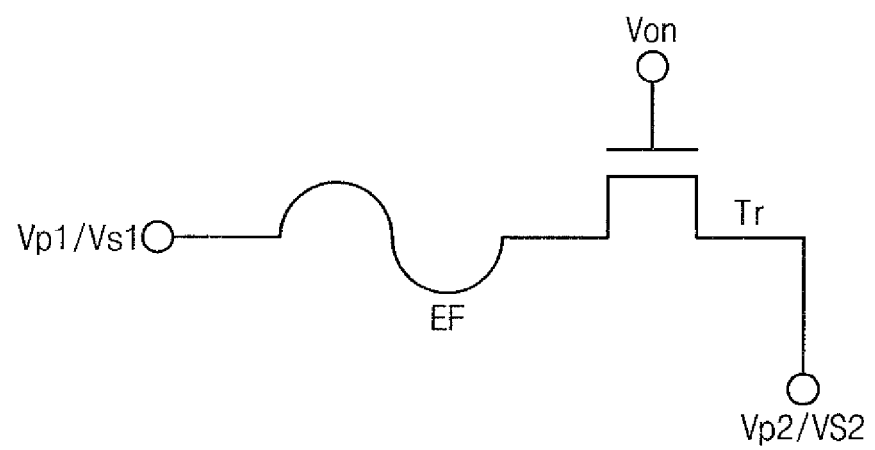
FIG. 1C is a circuit diagram illustrating a method of programming and sensing the e-fuse structure illustrated in FIG. 1B, according to an exemplary embodiment of the inventive concept.

In an exemplary embodiment, the conductive pattern 140 covering the first and second doped regions 120 and 130 is separated into segments that are disconnected from each other by voltages applied through the first and second interconnections 172 and 174 and the first and second contact plugs 162 and 164, as shown in FIGS. 1B and 1C. As a result, the e-fuse structure may be programmed.

FIG. 1B is a cross-sectional view illustrating a method of programming and sensing an e-fuse structure, according to an exemplary embodiment of the inventive concept. FIG. 1C is a circuit diagram illustrating methods of programming and sensing the e-fuse structure illustrated in FIG. 1B.

Referring to FIGS. 1B and 1C, a method of programming an e-fuse structure according to an exemplary embodiment will be described. The e-fuse structure EF, which includes the first and second doped regions 120 and 130, the conductive pattern 140 and the first and second contact plugs 162 and 164 illustrated in FIG. 1A, may be connected to a drive transistor Tr. In an exemplary embodiment, the drive transistor Tr includes a gate insulating layer GI, a gate electrode GE, a source S and a drain D. The gate insulating layer GI and the gate electrode GE may be stacked on the substrate 100. The source S and the drain D may be disposed at both sides of the gate electrode GE. The drain D of the drive transistor Tr may be electrically connected to the second interconnection 174.

In an exemplary embodiment, the first doped region 120 is doped with P-type dopants, the second doped region 130 is doped with N-type dopants, a first program voltage Vp1 having a first voltage level is applied to the first interconnection 172, a second program voltage Vp2 having a second voltage level substantially lower than the first voltage level is applied to the source S of the drive transistor Tr, and a turn-on voltage Von is applied to the gate electrode GE of the drive transistor Tr. The second program voltage Vp2 may be a ground voltage. When the turn-on voltage Von is applied to the gate electrode GE, a voltage having the same voltage level as the second program voltage Vp2 may be applied to a body region of the drive transistor Tr, which includes a channel region.

In an exemplary embodiment, a channel is generated in the substrate 100 under the gate electrode GE by the turn-on voltage Von, which is applied to the gate electrode GE. Thus, a forward bias may be applied to the PN diode including the first and second doped regions 120 and 130 by the first and second program voltages Vp1 and Vp2, and a program current Ip may flow in a direction from the first doped region 120 toward the second doped region 130. Most of the program current Ip may flow in the conductive pattern 140, which has a resistivity substantially less than the resistivity of the first and second doped regions 120 and 130, and a remaining portion of the program current Ip may flow in the first and second doped regions 120 and 130. That is, most of the carriers (e.g. electrons) may flow in the conductive pattern 140 in a direction from the second doped region 130 toward the first doped region 120.

Atom ions (e.g. metal atoms ions) constituting the conductive pattern 140 may migrate from the second doped region 130 toward the first doped region 120 due to heat generated in the conductive pattern 140 by the program current Ip, and due to migration of the carriers in the conductive pattern 140. That is, the conductive pattern 140 may be ruptured by electromigration. Thus, the conductive pattern 140 may be separated into first and second segments 140a and 140b which are disconnected from each other, as shown in FIG. 1B. As a result, the e-fuse structure EF may be programmed.

In an exemplary embodiment, the first segment 140a is in contact with the first doped region 120 and the first contact plug 162, and is not in contact with the second contact plug 164. The second segment 140b is in contact with the second doped region 130 and the second contact plug 164, and is not in contact with the first contact plug 162.

In an exemplary embodiment, the first doped region 120 is doped with N-type dopants, the second doped region 130 is doped with P-type dopants, the first program voltage Vp1 having the first voltage level is applied to the first interconnection 172, the second program voltage Vp2 having the second voltage level is applied to the source S of the drive transistor Tr, and the turn-on voltage Von is applied to the gate electrode GE of the drive transistor Tr.

As a result, a reverse bias may be applied to the PN diode including the first and second doped regions 120 and 130, and the program current Ip may flow in the conductive pattern 140 in a direction from the first doped region 120 toward the second doped region 130. That is, carriers (e.g. electrons) may migrate in the conductive pattern 140 in a direction from the second doped region 130 toward the first doped region 120.

As described above, the conductive pattern 140 may be separated into the first and second segments 140a and 140b due to the heat generated in the conductive pattern 140 by the program current Ip, and due to migration of the carriers in the conductive pattern 140. As a result, the e-fuse structure EF may be programmed.

A method of sensing an e-fuse structure according to an exemplary embodiment will be described with reference to FIGS. 1B and 1C.

Referring to FIG. 1B, a resistance value between the first and second contact plugs 162 and 164 and/or a current value between the first and second contact plugs 162 and 164 may be measured to sense whether the e-fuse structure EF is programmed. In FIG. 1B, a first sensing voltage Vs1 having a first voltage level and a second sensing voltage Vs2 having a second voltage level substantially lower than the first voltage level are applied to the first contact plug 162 and the second contact plug 164, respectively. In this case, a voltage level difference between the first and second sensing voltages Vs1 and Vs2 applied to the first and second contact plugs 162 and 164 may be substantially smaller than a voltage level difference between the first and second program voltages Vp1 and Vp2. Thus, the conductive pattern 140 of an e-fuse structure EF that is not programmed is not disconnected when the first and second sensing voltages Vs1 and Vs2 are applied to the first and second contact plugs 162 and 164, respectively.

In an exemplary embodiment, when the first doped region 120 is doped with P-type dopants and the second doped region 130 is doped with N-type dopants, a forward bias may be applied to the PN diode including the first and second doped regions 120 and 130 by the first and second sensing voltages Vs1 and Vs2. In an exemplary embodiment, when the first doped region 120 is doped with N-type dopants and the second doped region 130 is doped with P-type dopants, a reverse bias may be applied to the PN diode including the first and second doped regions 120 and 130 by the first and second sensing voltages Vs1 and Vs2.

As described above, a forward or reverse bias may be applied to the PN diode including the first and second doped regions 120 and 130. Application of the forward or reverse bias allows for the measurement of the resistance value and/or the current value between the first and second contact plugs 162 and 164. A first resistance value measured in a programmed e-fuse structure EF including the first and second segments 140a and 140b may be substantially greater than a second resistance value measured in a non-programmed e-fuse structure EF. In addition, a first current value measured in a programmed e-fuse structure EF may be substantially less than a second current value measured in a non-programmed e-fused structure EF. Thus, an e-fuse structure may be sensed by determining a difference between first and second resistance values and/or a difference between first and second current values.

In an e-fuse structure according to an exemplary embodiment of the inventive concept, the first and second doped regions 120 and 130 may be disposed in the well region 110 to be isolated. Thus, the influence of the currents and/or voltages used for sensing and programming the e-fuse structure on peripheral circuits of the e-fuse structure may be decreased. As a result, reliability of the e-fuse structure may be increased.

Additionally, before the e-fuse structure is programmed, the drive transistor Tr may be turned off to discharge noise applied to the e-fuse structure through the first interconnection 172 into the substrate 100 through the well region 110. As a result, reliability of the e-fuse structure may be increased.

Further, in an exemplary embodiment, a well region bordering the first and second doped regions 120 and 130 may include portions which are doped with dopants of conductivity types different from each other, as described with reference to FIG. 2.

Figure 2:
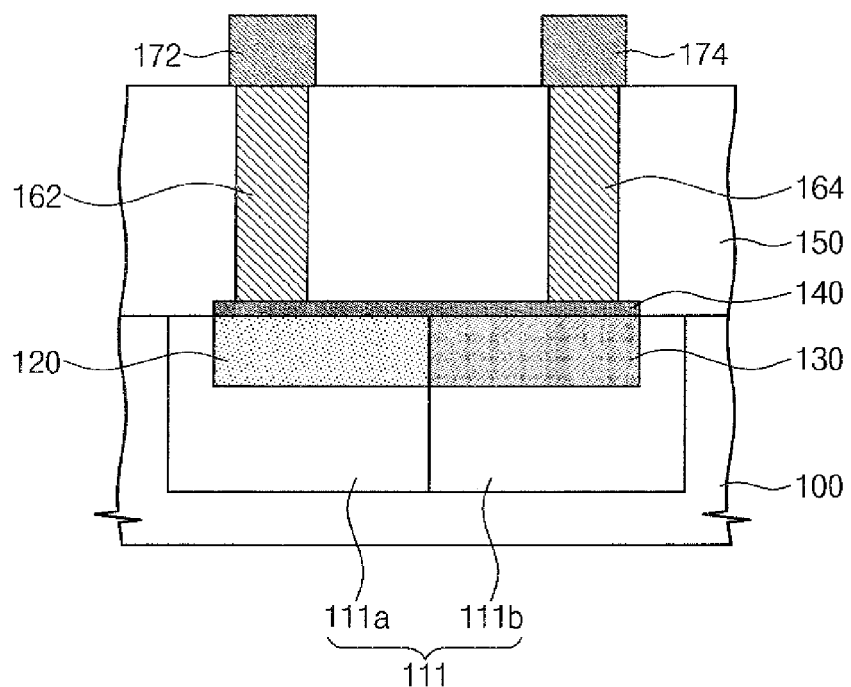
FIG. 2 is a cross-sectional view illustrating a well region included in an e-fuse structure, according to an exemplary embodiment of the inventive concept.

FIG. 2 is a cross-sectional view illustrating a well region included in an e-fuse structure according to an exemplary embodiment of the inventive concept. Referring to FIG. 2, the same elements as described with reference to FIG. 1 may be indicated by the same reference numerals or the same reference designators.

Referring to FIG. 2, a well region 111 is disposed in the substrate 100. The well region 111 includes a first part 111a and a second part 111b. The first part 111a of the well region 111 may be a portion of the substrate 100 doped with dopants of a first conductivity type, and the second part 111b of the well region 111 may be a portion of the substrate doped with dopants of a second conductivity type different from the first conductivity type. The first and second parts 111a and 111b may be in contact with each other.

In FIG. 2, the first doped region 120 doped with dopants of the first conductivity type is disposed in the first part 111a of the well region 111. A concentration of the dopants of the first conductivity type of the first doped region 120 may be substantially higher than the concentration of the dopants of the first part 111a of the well region 111. The first part 111a may border the first doped region 120.

In FIG. 2, the second doped region 130 doped with dopants of the second conductivity type is disposed in the second part 111b of the well region 111. The second doped region 130 may be in contact with the first doped region 120. A concentration of the dopants of the second conductivity type of the second doped region 130 may be substantially higher than the concentration of the dopants of the second part 111b of the well region 111. The second part 111b may border the second doped region 130.

In an exemplary embodiment, a junction surface of the first and second doped regions 120 and 130 is substantially aligned with a junction surface of the first and second parts 111a and 111b.

In an exemplary embodiment, the conductive pattern 140, the interlayer dielectric layer 150, the first and second contact plugs 162 and 164, and the first and second interconnections 172 and 174, which are described with reference to FIG. 1A, are provided on the substrate 100. The e-fuse structure may be programmed and/or sensed through the method described with reference to FIG. 1B.

An e-fuse structure according to an exemplary embodiment of the inventive concept may be implemented on a silicon-on-insulator (SOI) substrate, as described with reference to FIG. 3.

Figure 3:
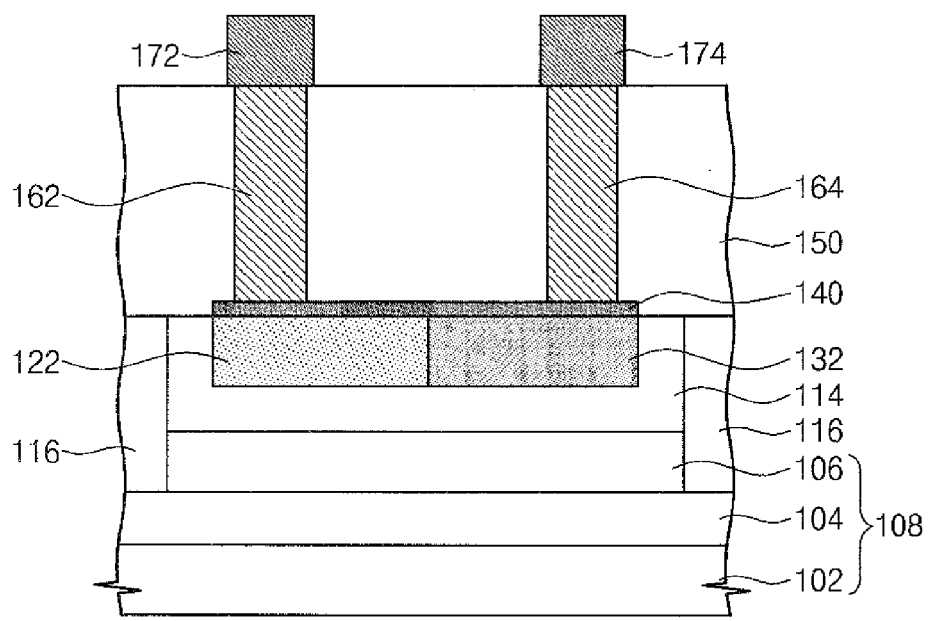
FIG. 3 is a cross-sectional view illustrating an e-fuse structure, according to an exemplary embodiment of the inventive concept.

FIG. 3 is a cross-sectional view illustrating an e-fuse structure according to an exemplary embodiment of the inventive concept.

Referring to FIG. 3, a substrate 108 includes a base substrate 102, a buried insulating layer 104 disposed on the base substrate 102, and a semiconductor material layer 106 disposed on the buried insulating layer 104. The base substrate 102 may include, for example, a semiconductor material. The buried insulating layer 104 may include, for example, an oxide layer.

In an exemplary embodiment, a well region 114 is disposed in the semiconductor material layer 106. The well region 114 may be a portion of the semiconductor material layer 106 which is doped with dopants of a first conductivity type.

In an exemplary embodiment, first and second doped region 122 and 132 in contact with each other are disposed in the well region 114. The first doped region 122 may be doped with dopants of the first conductivity type, and the second doped region 132 may be doped with dopants of a second conductivity type different from the first conductivity type. The first and second doped regions 122 and 132 may be included in a PN diode. A concentration of the dopants of the first conductivity type of the first doped region 122 may be substantially higher than that the concentration of the dopants of the well region 114.

In an exemplary embodiment, a device isolation pattern 116 is disposed at sides of the well region 114 and the semiconductor material layer 106, as shown in FIG. 3. The device isolation pattern 116 may include, for example, an insulating material.

In an exemplary embodiment, the conductive pattern 140 is disposed over the well region 114 and covers the first and second doped regions 122 and 132. The conductive pattern 140 contacts the first and second doped regions 122 and 132. The conductive pattern 140 may be formed of the same material as described with reference to FIG. 1A.

In an exemplary embodiment, the interlayer dielectric layer 150 is disposed on the substrate 108 and covers the first and second doped regions 122 and 132 and the conductive pattern 140. First and second contact plugs 162 and 164 penetrate the interlayer dielectric layer 150 and contact the conductive pattern 140. First and second interconnections 172 and 174 are disposed on the interlayer dielectric layer 150 and contact the first and second contact plugs 162 and 164, respectively.

The e-fuse structure according to the exemplary embodiment shown in FIG. 3 includes the first and second doped regions 122 and 132. The first and second doped regions 122 and 132 are disposed in the well region 114 within the semiconductor material layer 106, which is bordered by the device isolation pattern 116 and the buried insulating layer 104. Thus, when the e-fuse structure is programmed using, for example, the method described with reference to FIG. 1B, leakage of the program current may be decreased. As a result, reliability of the e-fuse structure may be increased.

Figure 4:
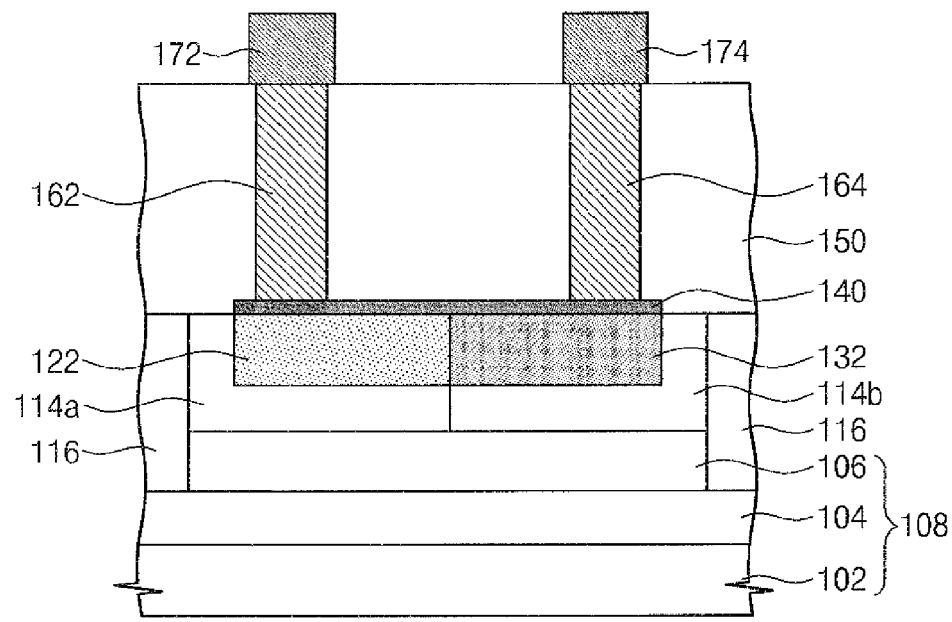
FIG. 4 is a cross-sectional view illustrating a well region included in an e-fuse structure, according to an exemplary embodiment of the inventive concept.

In an exemplary embodiment, a well region bordering the first and second doped regions 122 and 132 may include portions doped with dopants of different conductivity types, as shown in FIG. 4.

FIG. 4 is a cross-sectional view illustrating a well region included in an e-fuse structure according to an exemplary embodiment of the inventive concept. Referring to FIG. 4, the same elements as described with reference to FIG. 3 may be indicated by the same reference numerals or the same reference designators.

Referring to FIG. 4, the substrate 108 including the base substrate 102, the buried insulating layer 104, and the semiconductor material layer 106, which is described with reference to FIG. 3, is provided. A well region 114a and 114b is disposed in the semiconductor material layer 106. The well region 114a and 114b includes a first part 114a of a first conductivity type and a second part 114b of a second conductivity type different from the first conductivity type. For example, the first part 114a may be a portion of the semiconductor material layer 106 which is doped with dopants of a first conductivity type, and the second part 114b may be a portion of the semiconductor layer 106 which is doped with dopants of a second conductivity type.

In an exemplary embodiment, the first doped region 122 of the first conductivity type and the second doped region 132 of the second conductivity are disposed in the first part 114a and the second part 114b, respectively. The concentration of the dopants of the first conductivity type of the first doped region 122 may be substantially higher than the concentration of the dopants of the first part 114a. The concentration of the dopants of the second conductivity type of the second doped region 132 may be substantially higher than the concentration of the dopants of the second part 114b.

In FIG. 4, the device isolation pattern 116, the conductive pattern 140, the interlayer dielectric layer 150, the first and second contact plugs 162 and 164, and the first and second interconnections 172 and 174, which are described with reference to FIG. 3, are provided on the substrate 108. The resulting e-fuse structure may be programmed and/or sensed using the method described with reference to FIG. 1B.

Figure 5A:
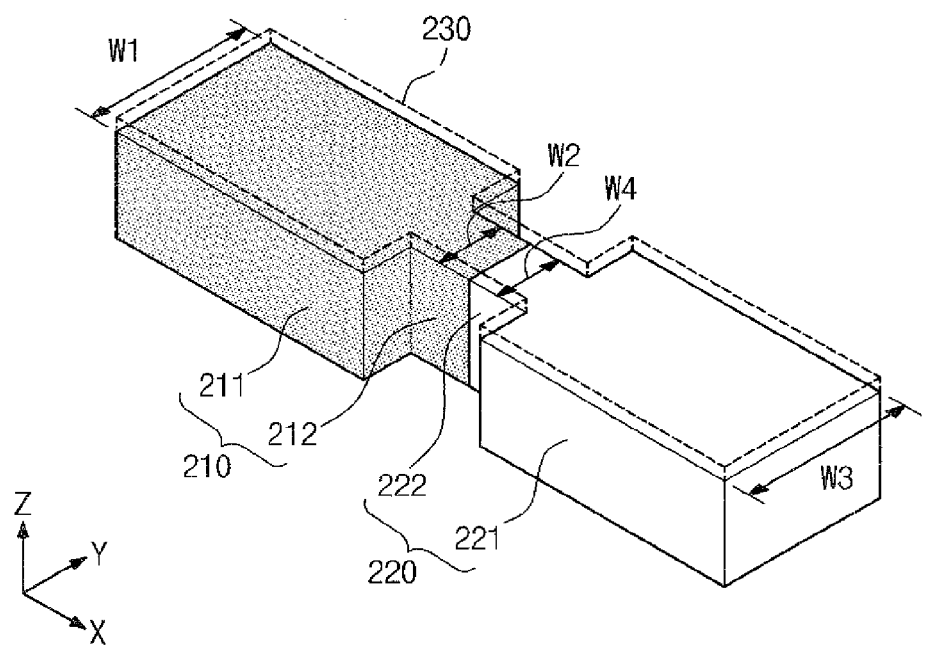
FIGS. 5A to 5C are perspective views illustrating an e-fuse structure including first and second doped regions, according to exemplary embodiments of the inventive concept.
Figure 5B:
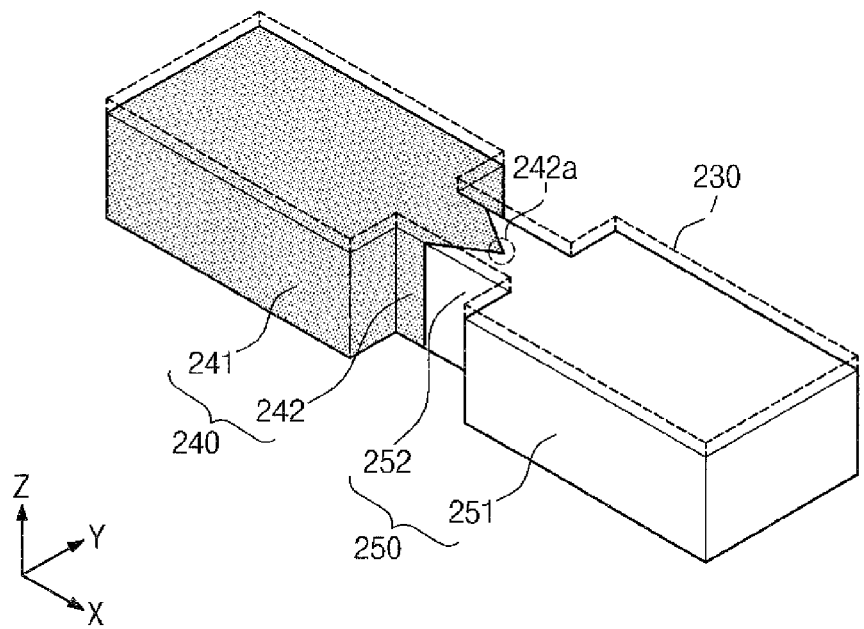
Figure 5C:
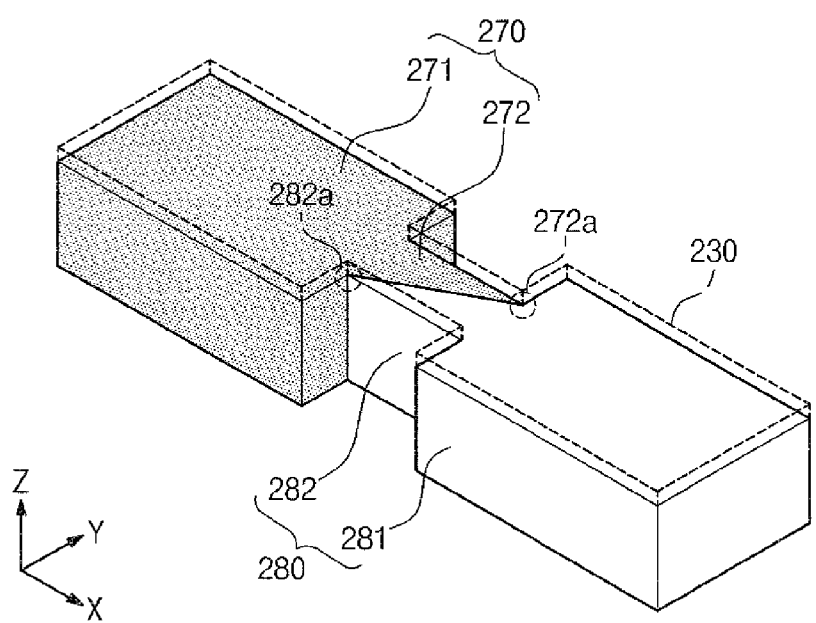

First and second doped regions in the e-fuse structures according to the exemplary embodiments described above may have various shapes. Exemplary embodiments of the e-fuse structures including first and second doped regions will be described with reference to FIGS. 5A to 5C. In FIGS. 5A to 5C, the first and second doped regions and the conductive pattern on the first and second doped regions are shown. For convenience of description, other elements, such as, for example, the substrate, well region, contact plugs and interconnections, are omitted.

FIG. 5A is a perspective view illustrating an e-fuse structure including first and second doped regions, according to an exemplary embodiment of the inventive concept.

Referring to FIG. 5A, an e-fuse structure according to an exemplary embodiment includes a first doped region 210 of a first conductivity type and a second doped region 220 of a second conductivity type different from the first conductivity type. The first and second doped regions 210 and 220 may be disposed in one of the well regions described with reference to FIGS. 1A, 1B, 2, 3 and 4. The first and second doped regions 210 and 220 are arranged in a first direction. In FIG. 5A, the first direction corresponds to the X-axis.

In an exemplary embodiment, the first doped region 210 includes a first portion 211 and a second portion 212. The first portion 211 has a first width W1 in a second direction. The second portion 212 extends from one end of the first portion 211 along the first direction, and has a second width W2 substantially less than the first width W1 in the second direction. The second direction is substantially perpendicular to the first direction. In FIG. 5A, the second direction corresponds to the Y-axis. The first portion 211 may have a substantially uniform width W1 in the second direction, and the second portion 212 may have a substantially uniform width W2 in the second direction.

In an exemplary embodiment, the second doped region 220 includes a third portion 221 and a fourth portion 222. The third portion 221 has a third width W3 in the second direction. The fourth portion 222 extends from one end of the third portion 221 and has a fourth width W4 substantially less than the third width W3 in the second direction. The fourth portion 222 of the second doped region 220 contacts the second portion 212 of the first doped region 210. The third portion 221 may have a substantially uniform width W3 in the second direction, and the fourth portion 222 may have a substantially uniform width W4 in the second direction.

In FIG. 5A, a conductive pattern 230 is disposed on the first and second doped regions 210 and 220. The conductive pattern 230 may include the same material as the conductive pattern 140 described with reference to FIG. 1A.

In an exemplary embodiment, the second portion 212 having a width W2 substantially narrower than the width W1 of the first portion 211 contacts the fourth portion 222 having a width W4 substantially narrower than the width W3 of the third portion 221. Thus, as described with reference to FIG. 1B, the e-fuse structure including the first and second doped regions 210 and 220 may be programmed. In this case, a program current flowing in the first and second doped regions 210 and 220, and/or a program current flowing through an interface between the conductive pattern 230 and the doped regions 210 and 220, may be concentrated on a contact region of the second and fourth portions 212 and 222. Thus, the electromigration phenomenon may intensively occur in a region of the conductive pattern 230 which corresponds to the contact region of the second and fourth portions 212 and 222. As a result, the e-fuse structure may be efficiently programmed.

FIG. 5B is a perspective view illustrating an e-fuse structure including first and second doped regions, according to an exemplary embodiment of the inventive concept.

Referring to FIG. 5B, an e-fuse structure according to an exemplary embodiment includes a first doped region 240 of a first conductivity type and a second doped region 250 of a second conductivity type different from the first conductivity type. The first and second doped regions 240 and 250 may be disposed in one of the well regions described with reference to FIGS. 1A, 1B, 2, 3, and 4. The first and second doped regions 240 and 250 are arranged in a first direction. In FIG. 5B, the first direction corresponds to the X-axis.

In an exemplary embodiment, the first doped region 240 includes first and second portions 241 and 242, and the second doped region 250 includes a third portion 251 and a fourth portion 252 contacting the second portion 242.

In an exemplary embodiment, the first portion 241 of the first doped regions 240 may have a substantially uniform width in a second direction. The second direction is substantially perpendicular to the first direction. In FIG. 5B, the second direction corresponds to the Y-axis. The second portion 242 extends from one end of the first portion 241 in the first direction. As shown in FIG. 5B, the width of the second portion 242 in the second direction may decrease as it becomes farther from the first portion 241. That is, the width of the second portion 242 in the second direction may become progressively less toward the fourth portion 252. The second portion 242 of the first doped region 240 may include a minimum width portion 242a having a minimum width in the second direction.

The third portion 251 of the second doped region 250 may have substantially the same width as the width of the first portion 241 in the second direction. The fourth portion 252 extends from the third portion 251 in the first direction and contacts the second portion 242. The third portion 251 includes two branch portions surrounding the minimum width-portion 242a of the second portion 242.

The e-fuse structure including the first and second doped regions 240 and 250 may be programmed using the method described with reference to FIG. 1B. In this case, a program current flowing in the first and second doped regions 240 and 250, and/or a program current flowing through an interface between the conductive pattern 230 and the doped regions 240 and 250 may be concentrated on the minimum width-portion 242a of the second portion 242. Thus, the electromigration phenomenon may intensively occur in a region of the conductive pattern 230 which corresponds to the minimum width-portion 242a. As a result, the e-fuse structure may be efficiently programmed.

FIG. 5C is a perspective view illustrating an e-fuse structure including first and second doped regions, according to an exemplary embodiment of the inventive concept.

Referring to FIG. 5C, an e-fuse structure according to an exemplary embodiment includes a first doped region 270 of a first conductivity type and a second doped region 280 of a second conductivity type different from the first conductivity type. The first and second doped regions 270 and 280 may be disposed in one of the well regions described with reference to FIGS. 1A, 1B, 2, 3, and 4. The first and second doped regions 270 and 280 are arranged in a first direction. In FIG. 5C, the first direction corresponds to the X-axis.

In an exemplary embodiment, the first doped region 270 includes first and second portions 271 and 272, and the second doped region 280 includes a third portion 281 and a fourth portion 282 contacting the second portion 272.

In an exemplary embodiment, the first portion 271 of the first doped region 270 may have a substantially uniform width in a second direction. The second direction is substantially perpendicular to the first direction. In FIG. 5C, the second direction corresponds to the Y-axis. The second portion 272 extends from one end of the first portion 271. As shown in FIG. 5C, the width of the second portion 272 in the second direction may decrease as it becomes farther from the first portion 271. That is, the width of the second portion 272 in the second direction may become progressively less toward the fourth portion 282. The second portion 272 includes a first side extending in the first direction, a second side oblique to the first side, and a third side contacting the first portion 271 when viewed from a plan view. In a plan view, the second portion 272 includes a minimum width portion 272a which has a minimum width in the second direction and is disposed in a connecting region of the first and second sides.

In an exemplary embodiment, the third portion 281 may have a substantially uniform width in the second direction. The fourth portion 282 extends from one end of the third portion 281 in the first direction and contacts the second portion 272. The width of the fourth portion 282 in the second direction may decrease as it becomes farther from the third portion 281. That is, the width of the fourth portion 282 in the second direction may become progressively less toward the second portion 272. The fourth portion 282 includes a fourth side extending in the first direction, a fifth side oblique to the fourth side, and a sixth side contacting the third portion 281 when viewed from a plan view. In a plan view, the fourth portion 282 includes a minimum width portion 282a which has a minimum width in the second direction and is disposed in a connecting region of the fourth and fifth sides. The second side of the second portion 272 may overlap with the fifth side of the fourth portion 282 in a plan view. The second side of the second portion 272 contact the fifth side of the fourth portion 282.

The e-fuse structure including the first and second doped regions 270 and 280 may be programmed using the method described with reference to FIG. 1B. In this case, a program current flowing in the first and second doped regions 270 and 280, and/or a program current flowing through an interface between the conductive pattern 230 and the doped regions 270 and 280, may be concentrated on the minimum width portion 272a of the second portion 272 and/or the minimum width portion 282a of the fourth portion 282. Thus, the electromigration phenomenon may intensively occur in regions of the conductive pattern 230 which correspond to the minimum width portion 272a of the second portion 272 and/or the minimum width portion 282a of the fourth portion 282. As a result, the e-fuse structure may be efficiently programmed.

The e-fuse structure according to the exemplary embodiments of the inventive concept described above may be formed, for example, using the same processes used for the formation of an NMOS and/or a PMOS transistor. Methods of manufacturing the e-fuse structure according to exemplary embodiments will be described hereinafter.

Figure 6B:
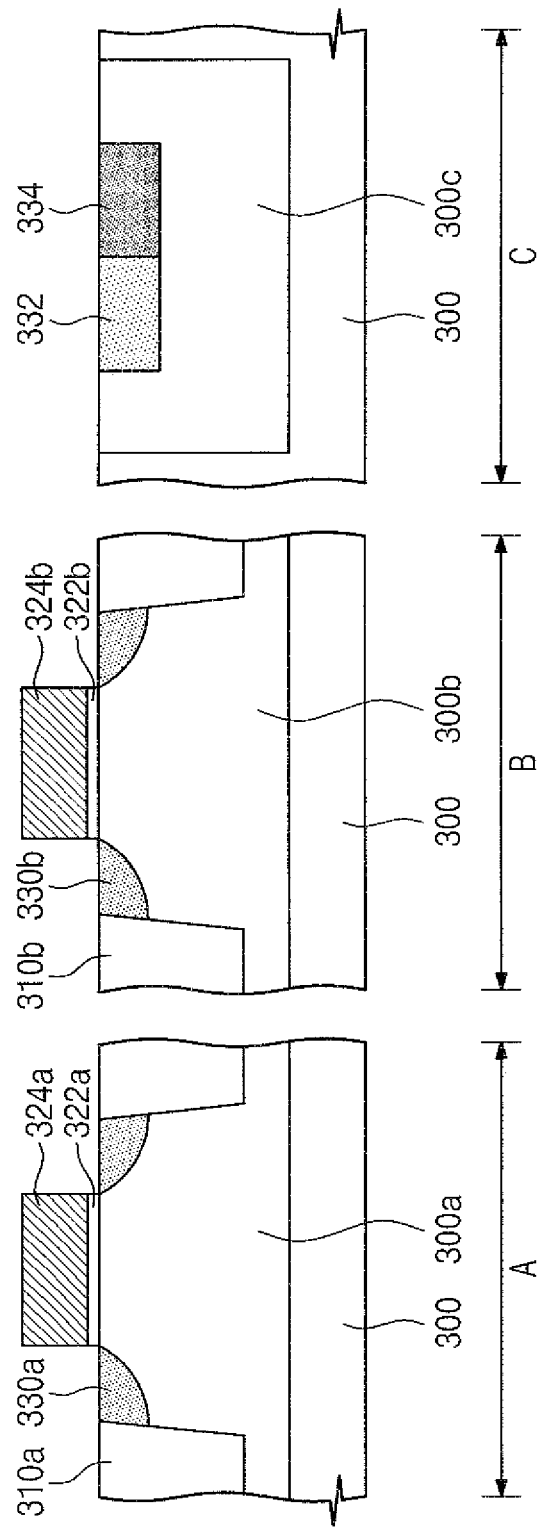

FIGS. 6A to 6C are cross-sectional views illustrating a method of manufacturing an e-fuse structure, according to exemplary embodiments of the inventive concept.

Referring to FIG. 6A, a substrate 300 includes first through third regions A, B, and C. An NMOS transistor may be formed in the first region A, a PMOS transistor may be formed in the second region B, and an e-fuse structure may be formed in the third region C.

In an exemplary embodiment, first, second and third well regions 300a, 300b, and 300c are formed in the first, second and third regions A, B, and C, respectively. The first well region 300a is doped with dopants of a first conductivity type and the second well region 300b is doped with dopants of a second conductivity type different from the first conductivity type. As described above, the third well region 300c may be doped with dopants of either the first or second conductivity type, or with dopants of both the first and second conductivity types.

Referring to FIG. 6B, a first device isolation pattern 310a defining a first active region is formed in the first well region 300a, and a second device isolation pattern 310b defining a second active region is formed in the second well region 300b. In an exemplary embodiment, a third isolation pattern may be formed in the third well region 300c.

In FIG. 6B, first and second gate insulating layers 322a and 322b are formed on the first and second active regions, respectively. First and second gate electrodes 324a and 324b are formed on the first and second gate insulating layers 322a and 322b, respectively.

In FIG. 6B, first source/drain regions 330a and second source/drain regions 330b are formed in the first well region 300a and the second well region 300b, respectively. The first source/drain regions 330a may be doped with dopants of the second conductivity type. The second source/drain regions 330b may be doped with dopants of the first conductivity type.

In FIG. 6B, a first doped region 332 of the first conductivity type and a second doped region 334 of the second conductivity type are formed in the third well region 300c. The first and second doped regions 332 and 334 may be formed using the same formation process as described with reference to the second and first source/drain regions 330b and 330a, respectively.

For example, the dopants of the first conductivity type may be injected into the third well region 300c to form the first doped region 332, which results in the injection of the dopants of the first conductivity type into the second well region 300b and the formation of the second source/drain regions 330b. The dopants of the second conductivity type may be injected into the third well region 300c to form the second doped region 334, which results in the injection of the dopants of the second conductivity type into the first well region 300a and the formation of the first source/drain regions 330a.

Referring to FIG. 6C, first and second ohmic patterns 340a and 340b are formed on the first and second source/drain regions 330a and 330b, respectively. First and second upper gate electrodes 342a and 342b are formed on the first and second gate electrodes 324a and 324b, respectively. A conductive pattern 340c is formed on the first and second doped regions 332 and 334.

The first and second ohmic pattern 340a and 340b, the first and second upper gate electrodes 342a and 342b, and the conductive pattern 340c may be formed of the same material and may be formed using the same manufacturing process. For example, the first and second ohmic pattern 340a and 340b, the first and second upper gate electrodes 342a and 342b, and the conductive pattern 340c may be formed of a metal-semiconductor compound. For example, the metal-semiconductor compound may include at least one of cobalt silicide, nickel silicide, titanium silicide, or tantalum silicide. In an exemplary embodiment, the first and second upper gate electrodes 342a and 342b may not be included.

In FIG. 6C, an interlayer dielectric layer 350 is formed on the substrate 300 including the first to third well regions 300a, 300b, and 300c. The interlayer dielectric layer 350 may be formed of, for example, an oxide layer and/or a nitride layer.

In FIG. 6C, first and second contact plugs 360a and 360b are formed, and penetrate the interlayer dielectric layer 350. The first and second contact plugs 360a and 360b contact the first and second source/drain regions 330a and 330b, respectively. Third contact plugs 360c are formed, and penetrate the interlayer dielectric layer 350. The third contact plugs 360c contact portions of the conductive pattern 340c on the first and second doped regions 332 and 334, respectively. The first to third contact plugs 360a, 360b, and 360c may be formed using the same process.

In FIG. 6C, first to third interconnections 370a, 370b, and 370c are formed on the interlayer dielectric layer 350 and contact the first to third contact plugs 360a, 360b, and 360c, respectively.

A semiconductor memory device may include redundant memory cells which are replaced with cells having defects. Additionally, the semiconductor memory device may include a fuse box in which an address program for switching from an address of a defect cell to an address of a redundant cell is performed. The fuse box may include at least one of the e-fuse structures according to the exemplary embodiments described above. If a defect is detected in a memory cell during testing of the semiconductor memory device, the e-fuse structure in the fuse box may be programmed to switch from the address of the defect cell to the address of a redundant cell. As a result, although defect cells may be present, the semiconductor memory device may still be utilized.

Figure 7:
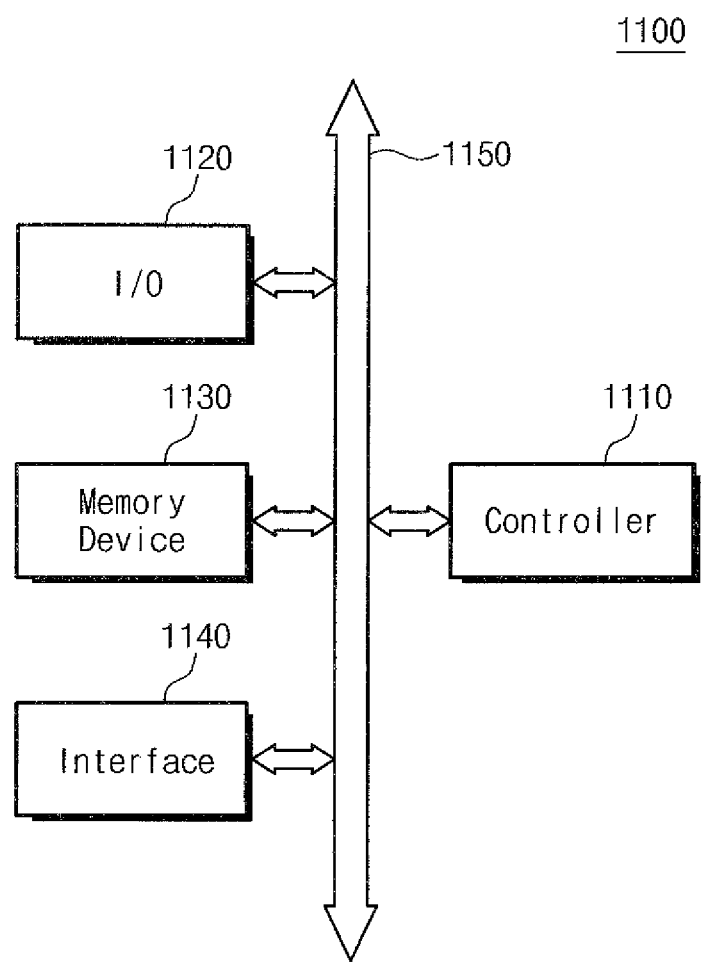
FIG. 7 is a schematic block diagram illustrating an electronic system including e-fuse structures, according to exemplary embodiments of the inventive concept.

FIG. 7 is a schematic block diagram illustrating an electronic system including e-fuse structures according to exemplary embodiments of the inventive concept.

Referring to FIG. 7, an electronic system 1100 according to exemplary embodiments of the inventive concept includes a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150.

The data bus 1150 corresponds to a path through which electrical signals are transmitted.

The controller 1110 may include, for example, at least one of a microprocessor, a digital signal processor, a microcontroller or another logic device. The other logic device may have a similar function to any one of the microprocessor, the digital signal processor and the microcontroller. The I/O unit 1120 may include, for example, a keypad, a keyboard and/or a display unit. The memory device 1130 stores data and/or commands. The memory device 1130 may include, for example, at least one of the e-fuse structures according to the exemplary embodiments described above. The memory device 1130 may further include, for example, a non-volatile memory device (e.g. a magnetic memory device, a phase change memory device, etc.), a dynamic random access memory (DRAM) device and/or a static random access memory (SRAM) device. The interface unit 1140 may transmit electrical data to a communication network or may receive electrical data from a communication network. The interface unit 1140 may operate via a wireless connection or a wired connection. For example, the interface unit 1140 may include an antenna for wireless communication and/or a transceiver for wired communication. The electronic system 1100 may further include a fast DRAM device and/or a fast SRAM device which function as a cache memory.

The electronic system 1100 may be, for example, a personal digital assistant (PDA), a portable computer, a tablet computer, a wireless phone, a mobile phone, a digital music player, a memory card, or other electronic products, and may receive or transmit information data via a wireless connection or a wired connection.

Figure 8:
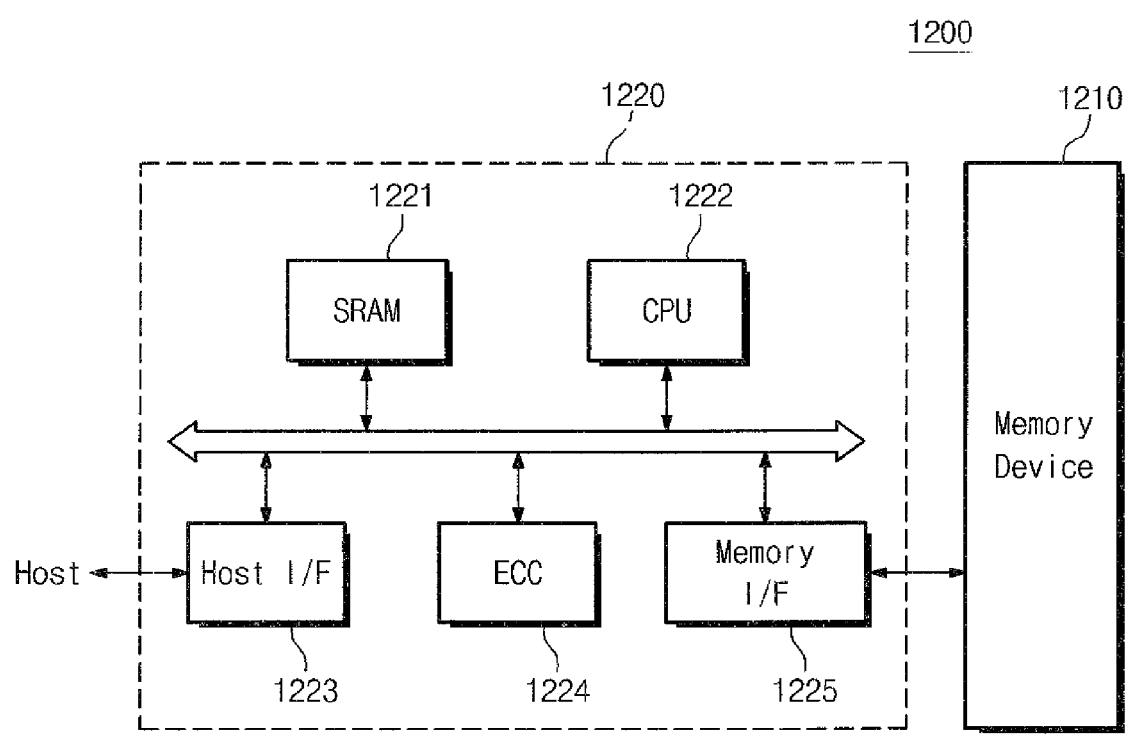
FIG. 8 is a schematic block diagram illustrating a memory card including e-fuse structures, according to exemplary embodiments of the inventive concept.

FIG. 8 is a schematic block diagram illustrating a memory card including e-fuse structures, according to exemplary embodiments of the inventive concept.

Referring to FIG. 8, a memory card 1200 according to exemplary embodiments of the inventive concept includes a memory device 1210. The memory device 1210 may include at least one of the e-fuse structures according to the exemplary embodiments described above. The memory device 1210 may include, for example, a non-volatile memory device (e.g. a magnetic memory device, a phase change memory device, etc.), a dynamic random access memory (DRAM) device and/or a static random access memory (SRAM) device. The memory card 1200 includes a memory controller 1220 that controls data communication between a host and the memory device 1210.

The memory controller 1220 includes, for example, a central processing unit (CPU) 1222 that controls operations of the memory card 1200. The memory controller 1220 may further include an SRAM device 1221 used as an operation memory of the CPU 1222, a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) unit 1224. The ECC unit 1224 may detect and correct errors in data read out from the memory device 1210. The memory card 1200 may further include, for example, a read only memory (ROM) device that stores code data to interface with the host. The memory card 1200 may be used, for example, as a portable data storage card or as solid state disks (SSD) which are used as hard disks of computer systems.

As described above, the e-fuse structure according to exemplary embodiments of the inventive concept may include a conductive pattern disposed on first and second doped regions having different conductivity types from each other, and first and second contact plugs disposed on the conductive pattern. The first and second doped regions may be formed in a substrate of the e-fuse structure. Thus, an e-fuse structure with high reliability may be provided.

While the inventive concept has been described with reference to the exemplary embodiments thereof, it will be understood by those skilled in the art that various changes and modifications may be made without departing from the spirit and scope of the inventive concept as defined by the following claims.

What is claimed is:

1. An e-fuse structure, comprising:
   a first doped region having a first conductivity type, wherein the first doped region is formed in a substrate;
   a second doped region having a second conductivity type, wherein the second doped region is formed in the substrate and contacts the first doped region, and the second conductivity type is different from the first conductivity type;
   a conductive pattern disposed on the first and second doped regions and contacting the first and second doped regions;
   a first contact plug disposed on the conductive pattern in an area corresponding to the first doped region;
   a second contact plug disposed on the conductive pattern in an area corresponding to the second doped region; and
   a well region disposed in the substrate,
   wherein the first and second doped regions are disposed in the well region,
   wherein the well region comprises a first portion having the first conductivity type and a second portion having the second conductivity type,
   wherein the first portion borders the first doped region and the second portion borders the second doped region.

2. The e-fuse structure of claim 1, wherein a concentration of dopants of the first conductivity type in the first doped region is higher than a concentration of dopants of the first conductivity type in the first portion, and a concentration of dopants of the second conductivity type in the second doped region is higher than a concentration of dopants of the second conductivity type in the second portion.

3. The e-fuse structure of claim 1, wherein the first and second doped regions are arranged in a first direction,
   wherein the first doped region comprises a first portion having a first width extending in a second direction substantially perpendicular to the first direction, and a second portion having a second width less than the first width extending in the second direction,
   wherein the second doped region comprises a third portion having a third width extending in the second direction, and a fourth portion having a fourth width less than the third width extending in the second direction,
   wherein the second portion contacts the fourth portion.

4. The e-fuse structure of claim 3, wherein the second width of the second portion decreases from the first portion toward the fourth portion.

5. The e-fuse structure of claim 1, wherein the first and second doped regions are arranged in a first direction,
  wherein the first doped region comprises a first portion having a first width and a second portion having a second width extending in a second direction substantially perpendicular to the first direction, and the second width of the second portion decreases toward the second doped region;
  wherein the second doped region comprises a third portion having a third width and a fourth portion having a fourth width extending in the second direction, and the fourth width of the fourth portion decreases toward the first doped region,
  wherein the second portion contacts the fourth portion.

6. The e-fuse structure of claim 1, wherein the conductive pattern comprises a first segment and a second segment, the first and second segments are disconnected from each other, the first segment contacts the first contact plug, and the second segment contacts the second contact plug.

7. The e-fuse structure of claim 1, wherein the first and second contact plugs are electrically connected to each other through the conductive pattern.

8. The e-fuse structure of claim 1, wherein the substrate comprises a base substrate, a buried insulating layer disposed on the base substrate, and a semiconductor material layer disposed on the buried insulating layer, wherein the well region is disposed in the semiconductor material layer.

9. The e-fuse structure of claim 8, further comprising:
  a device isolation pattern bordering the well region and the semiconductor material layer.

10. The e-fuse structure of claim 1, wherein the conductive pattern comprises a metal-semiconductor compound.

11. An e-fuse structure, comprising:
  a first doped region having a first conductivity type, wherein the first doped region is formed in a substrate;
  a second doped region having a second conductivity type, wherein the second doped region is formed in the substrate and contacts the first doped region, and the second conductivity type is different from the first conductivity type;
  a conductive pattern disposed on the first and second doped regions and contacting the first and second doped regions;
  a first contact plug disposed on the conductive pattern in an area corresponding to the first doped region;
  a second contact plug disposed on the conductive pattern in an area corresponding to the second doped region; and
  a well region disposed in the substrate,
  wherein the first and second doped regions are disposed in the well region,
  wherein the conductive pattern covers an area of the well region corresponding to the first and second doped regions, and does not cover an area of the well region adjacent to the first and second doped regions.

* * * * *